(12) United States Patent
van der Cammen

(10) Patent No.: US 10,048,300 B2
(45) Date of Patent: Aug. 14, 2018

(54) DETECTOR CIRCUIT

(71) Applicant: QUALCOMM Incorporated, San Diego, CA (US)

(72) Inventor: Peter van der Cammen, Berkel en Rodenrijs (NL)

(73) Assignee: QUALCOMM Technologies, Inc., San Diego, CA (US)

( * ) Notice: Subject to any disclaimer, the term of this patent is extended or adjusted under 35 U.S.C. 154(b) by 784 days.

(21) Appl. No.: 14/261,466

(22) Filed: Apr. 25, 2014

(65) Prior Publication Data

US 2015/0309098 A1    Oct. 29, 2015

(51) Int. Cl.
| | |
|---|---|
| *G01R 15/00* | (2006.01) |
| *G01R 19/00* | (2006.01) |
| *G01R 25/00* | (2006.01) |
| *G01R 27/02* | (2006.01) |

(52) U.S. Cl.
CPC .......... *G01R 25/005* (2013.01); *G01R 27/02* (2013.01)

(58) Field of Classification Search
CPC .............................. G01R 25/005; G01R 27/02
USPC ..................................................... 702/57, 64
See application file for complete search history.

(56) References Cited

U.S. PATENT DOCUMENTS

| | | | |
|---|---|---|---|
| 7,099,646 B1 * | 8/2006 | Jin ....................... | H03D 7/1425 331/117 R |
| 8,135,354 B2 | 3/2012 | Duron et al. | |
| 8,150,643 B1 | 4/2012 | Morrison et al. | |
| 2003/0021247 A1 * | 1/2003 | Sendonaris ......... | H04L 27/0014 370/335 |
| 2007/0035356 A1 | 2/2007 | Ranta | |
| 2007/0142017 A1 * | 6/2007 | Nishimuta ...... | H01L 21/823807 455/323 |
| 2009/0149149 A1 * | 6/2009 | Ruijs ................... | H03D 7/1433 455/323 |
| 2013/0169359 A1 | 7/2013 | Coumou | |
| 2013/0320852 A1 | 12/2013 | Kitano et al. | |
| 2015/0346251 A1 * | 12/2015 | van Der Cammen . | G01R 27/02 702/65 |
| 2015/0349833 A1 * | 12/2015 | van Der Cammen . | G01R 27/02 375/219 |

(Continued)

FOREIGN PATENT DOCUMENTS

SU         1515384 A1    10/1989

OTHER PUBLICATIONS

Wolfram MathWorld, Vector Addition, printed Oct. 9, 2017.*

(Continued)

*Primary Examiner* — Michael Nghiem
(74) *Attorney, Agent, or Firm* — Smith Tempel Blaha LLC/Qualcomm

(57) ABSTRACT

A device comprises a multiplication circuit configured to derive a product of a first signal $S_1$ and a second signal $S_2$, $S_2$ having a phase difference $\beta$ relative to the first signal $S_1$, a low pass filter configured to remove a selected frequency component from the product of $S_1$ and $S_2$ to derive a dot product $S_1 \cdot S_2$; and a calculation circuit configured to receive the dot product $S_1 \cdot S_2$ and generate a signal output having a ratio $|S_1|/|S_2|$ and the phase difference $\beta$.

10 Claims, 10 Drawing Sheets

(56) References Cited

U.S. PATENT DOCUMENTS

2015/0349982 A1* 12/2015 Van Der Cammen . G01R 25/02
375/317
2016/0349297 A1* 12/2016 van der
Cammen .............. H03D 7/1433

OTHER PUBLICATIONS

International Search Report and Written Opinion—PCT/US2015/026777—ISA/EPO—Jul. 22, 2015.
Asiminoaei L., et al., "A new method of on-line grid impedance estimation for PV inverter," Nineteenth Annual IEEE Applied Power Electronics Conference and Exposition, 2004, vol. 3, pp. 1527-1533.
Samantaray S.R., et al., "High impedance fault detection in distribution feeders using extended kalman filter and support vector machine," European Transactions on Electrical Power, 2009, 12 pages.

* cited by examiner

DETECTOR CIRCUIT

BACKGROUND

Field

The present invention relates to detector circuits, e.g. for impedance measurement systems.

Background

Impedance measurement systems can be used to determine the impedance of a signal path in a mobile communication device where the signal path's impedance depends on its external conditions. In other words, where the signal path has a variable load impedance. In the case of mobile communication devices with an antenna, the variable load impedance can be due to the antenna's changing environment.

In order to optimize the transmission coefficient of transmit (Tx) or receive (Rx) signals propagating in the signal path, the signal path's actual impedance must be known.

Conventional impedance measurement systems use two receive signal strength indicator (RSSI) chains as level detectors to measure two signal levels. An additional phase detector is needed to measure the phase between the two signal levels.

It would be desirable to provide a detector circuit for an impedance measurement system, without the need for an additional phase detector and without the need for a level detector, e.g. an RSSI-chain.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral encompass all parts having the same reference numeral in all figures.

DETAILED DESCRIPTION

The word "exemplary" is used herein to mean "serving as an example, instance, or illustration." Any aspect described herein as "exemplary" is not necessarily to be construed as preferred or advantageous over other aspects.

In this description, the term "application" may also include files having executable content, such as: object code, scripts, byte code, markup language files, and patches. In addition, an "application" referred to herein, may also include files that are not executable in nature, such as documents that may need to be opened or other data files that need to be accessed.

The term "content" may also include files having executable content, such as: object code, scripts, byte code, markup language files, and patches. In addition, "content" referred to herein, may also include files that are not executable in nature, such as documents that may need to be opened or other data files that need to be accessed.

An exemplary embodiment of a detector circuit comprises a first signal input determined to receive a first signal $S_1$, a second signal input determined to receive a second signal $S_2$ having a phase difference $\beta$ relative to the first signal $S_1$, and a multiplication circuit determined to derive the dot product $S_1 \cdot S_2$. Further, the detector circuit comprises a signal output determined to provide the ratio $|S_1|/|S_2|$. The signals $S_1$ and $S_2$ can be visualized in the complex plane and, thus, be interpreted as vectors. Accordingly the dot product $S_1 \cdot S_2$ is a well-defined quantity.

Figure 2:
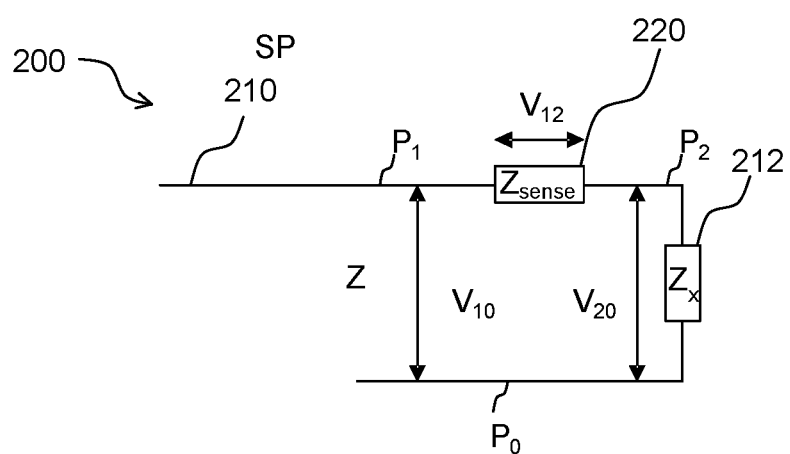
FIG. 2 shows an equivalent circuit diagram of a signal path comprising an unknown load impedance Zx and a sensing impedance Zsense.

An exemplary embodiment of a detector circuit may be used in an impedance measurement system for a signal path shown in FIG. 2. The signal path SP may be connected to an antenna having a variable load impedance. Such an antenna and its load impedance is represented by an impedance $Z_x$. Further, the signal path SP comprises a sensing impedance $Z_{sense}$ which may be an inductive element IE. $V_{20}$ denotes the voltage drop of the load impedance $Z_x$. $V_{12}$ denotes the voltage drop across the impedance $Z_{sense}$. $V_{10}$ is the sum of the voltages $V_{20}$ and $V_{12}$: $V_{10}=V_{20}+V_{12}$. Thus, the impedance of the signal path SP equals the load impedance $Z_x$ plus the sensing impedance $Z_{sense}$ which may be a known impedance. From FIG. 2, it is clear that $Z=Z_{sense} V_{10}/V_{12}$ where $V_{10}$ and $V_{12}$ are voltages representable as complex numbers.

The situation shown in FIG. 2 can be described with parameters other than voltages $V_{10}$, $V_{12}$, and $V_{20}$, i.e. exemplary embodiments of the detector circuit do not depend on details of parameters used as signal inputs for the detector circuit. Other parameters, e.g. current information, are also possible.

Thus, deriving the unknown impedance Z can be accomplished by determining the ratio $V_{10}/V_{12}$. Here, $V_{10}$ may be written as $V_{10}=|V_{10}| \exp(j\omega t)$. Then, $V_{12}$ may be written as $V_{12}=|V_{12}|\exp((j\omega t)+\varphi)$, i.e. $V_{10}$ and $V_{12}$ are signals of the same frequency with a phase difference of $\varphi$ between $V_{10}$ and $V_{12}$. Accordingly, the ratio $V_{10}/V_{12}$ can be written as $V_{10}/V_{12}=|V_{10}|/|V_{12}| \exp(j\varphi)$. The correlations between $V_{10}$, $V_{12}$, and $V_{20}$ are drawn in a complex plane view in FIG. 3.

Accordingly, deriving the ratio $V_{10}/V_{12}$ can be accomplished by deriving the ratio of the absolute values $|V_{10}|/|V_{12}|$ and by obtaining a measure for the phase difference $\varphi$. Previous circuits use two RSSI-chains to obtain the ratio of the absolute values. A further discrete phase detector is then used to obtain phase information.

Exemplary embodiments of the detector circuit are based on the fact that the complex ratio $V_{10}/V_{12}$ intrinsically comprises the phase information. In an exemplary embodiment, the detector circuit provides direct access to phase information by processing three signals, e.g. $V_{10}$, $V_{20}$ and $V_{12}$.

In an exemplary embodiment, the detector circuit uses a geometric correlation between signal levels and phase information and electric circuitry that makes use of this correlation.

Accordingly, an exemplary embodiment of the detector circuit comprises a multiplication circuit that derives the dot product $V_{10} \cdot V_{12}$ when $V_{10}$ equals $S_1$ and $V_{12}$ equals $S_2$.

$V_{10} \cdot V_{12} = |V_{10}||V_{12}| \cos \varphi$. Thus, the dot product $V_{10} \cdot V_{12}$ is proportional to $\cos \varphi$ as a measure for the phase difference $\varphi$.

In an exemplary embodiment, the detector circuit further comprises a third signal input configured to receive a third signal $S_3$ having a phase difference $\alpha$ relative to the first signal $S_1$.

Since $S_1 - S_2 = S_3$, two signals, selected from $S_1$, $S_2$ and $S_3$ already contain enough information to determine the complex impedance Z. Processing the third signal enables technically advanced exemplary embodiments of the detector circuit with higher accuracy.

In an exemplary embodiment, the multiplication circuit derives three dot products $S_1 \cdot S_2$, $S_2 \cdot S_3$, and $S_1 \cdot S_3$.

When the dot products $S_1 \cdot S_2$, $S_2 \cdot S_3$, and/or $S_1 \cdot S_3$ are known then all ratios $|S_1|/|S_2|$, $|S_1|/|S_3|$, $|S_3|/|S_2|$ and the respective inverse ratios can be obtained. Further, the values for $\cos \alpha$, $\cos \beta$, and $\cos \gamma$ as measures for the phase differences between the signal inputs ($\alpha$ being the phase difference between $S_1$ and $S_3$; $\beta$ being the phase difference between $S_1$ and $S_2$, $\gamma$ being the phase difference between $S_2$ and $S_3$) can be obtained.

In an exemplary embodiment, one of the signals $S_1$, $S_2$, $S_3$ is the sum of the respective other two signals.

In an exemplary embodiment the multiplication circuit comprises a multiplier and a low pass filter.

The multiplier circuit of the multiplication circuit may be fed with input signals of the form:

$$V_1(t) = |V_1| \sin \omega t \qquad (1)$$

$$V_2(t) = |V_2| \sin(\omega t + \varphi') \qquad (2)$$

Multiplication yields:

$$V_1(t) V_2(t) = \frac{1}{2} |V_1||V_2| \{\cos \varphi' - \cos(2\omega t + \varphi')\} \qquad (3)$$

The low pass filter may absorb the component of the frequency $2\omega$ and provide a signal proportional to $|V_1||V_2| \cos \varphi'$, which is exactly the dot product of $V_1 \cdot V_2$.

Thus, with $V_1$, $V_2$ being two values selected from $S_1$, $S_2$, $S_3$, each of the dot products $S_1 \cdot S_2$, $S_2 \cdot S_3$, and $S_1 \cdot S_3$ can be obtained.

With:

$$k_1 = S_1 \cdot S_2 / S_2 S_3$$

$$k_2 = S_1 \cdot S_2 / S_1 \cdot S_3$$

$$k_3 = S_2 \cdot S_3 / S_1 \cdot S_3$$

The ratios of the rational numbers $|S_1|/|S_2|$ can be obtained:

$$(|S_1|/|S_2|)^2 = k_1(k_2+1)/(k_2(k_1-1))$$

and $$|S_1|/|S_2| = \sqrt{k_1(k_2+1)/(k_2(k_1-1))}$$

Similarly $|S_1|/|S_3|$ and $|S_2|/|S_3|$ can be obtained.

Further, by utilizing the cosine rule $c^2 = a^2 + b^2 - 2ab \cos \gamma$ (with $\gamma$ being the phase difference between a and b and a, b and c being understandable as the sides of a triangle) measures for the phase differences between the input signals can be obtained:

$$\cos \beta = \frac{1}{2}(|S_1|/|S_2| + |S_2|/|S_1| - (|S_3|/|S_1||S_3|/|S_2|)).$$

Similarly the respective other two phase differences can be obtained.

Thus, obtaining all three input signals $S_1$, $S_2$, $S_3$ is preferred. However, exemplary embodiments of the detector circuit can also work with two inputs for signals $S_1$, $S_2$ only. This is if the detector works in a mode where the three different signals are provided one after another. Then, a memory is used for storing processed values, but only one calculation circuit is needed.

Figure 3:
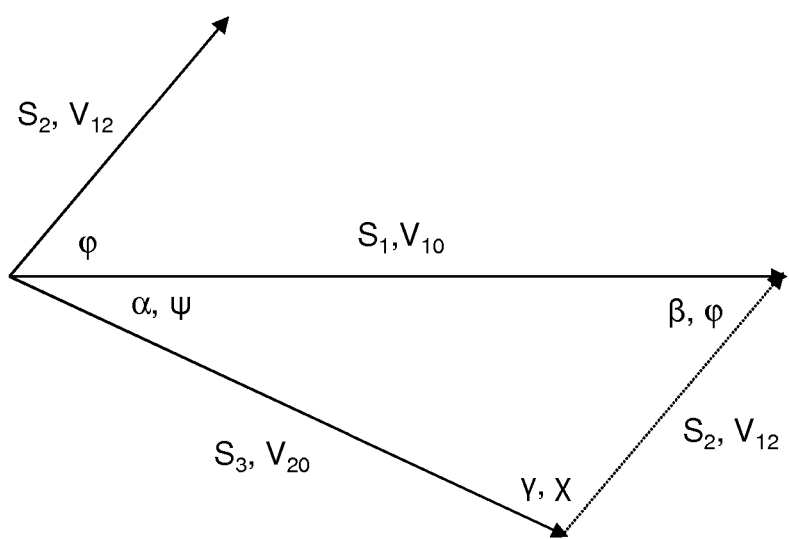
FIG. 3 shows fundamental correlations between the different input signals and their respective phase differences.

In an exemplary embodiment, the first signal $S_1$, the second signal $S_2$ and the third signal $S_3$ are voltage or current signals. Then, $S_1$ can equal $V_{10}$, $S_2$ can equal $V_{12}$ and $S_3$ can equal $V_{20}$. The phase difference between $V_{10}$, $V_{12}$ and $V_{20}$ are $\varphi$, $\psi$ and $\chi$ as shown in FIG. 3.

In an exemplary embodiment, the detector circuit further comprises a calculation circuit. The calculation circuit can obtain signals that are proportional to $|V_1||V_2| \cos \varphi'$ for $V_1$ and $V_2$, etc. being the input signals from the multiplication circuit. Based on the above equations the ratios $|S_1|/|S_2|$, $|S_1|/|S_3|$, $|S_2|/|S_3|$ and measures for the phase differences $\beta$, $\alpha$, and $\gamma = 180° - \beta - \alpha$ can easily be derived via the calculation circuit.

In an exemplary embodiment, the detector circuit further comprises an analog/digital converter. The analog/digital converter can be connected between the multiplication circuit and the calculation circuit. Then the calculation circuit works in the digital domain. However, it is possible that the calculation circuit works in the analog domain and the analog/digital converter is connected behind the calculation circuit.

In an exemplary embodiment, the analog/digital converter is connected before the multiplication circuit. Then, the multiplication circuit and the calculation circuit can work in the digital domain. In this configuration, the multiplication circuit can be integrated in the calculation circuit.

In an exemplary embodiment, the detector circuit further comprises two subtraction circuits determined to derive $V_{10}$ and $V_{12}$ from three input potentials $P_0$, $P_1$, $P_2$.

In an exemplary embodiment, the detector circuit further comprises a feedback network that generates information about the ratio of two dot products.

In an exemplary embodiment, the multiplication circuit of the detector circuit comprises two (2) double balanced mixers or Gilbert cells, a circuit that is adapted to iteratively generate a digital code based on up/down information at an 1 bit input or an updown-counter, and a feedback network.

In an exemplary embodiment, the signal output of the detector circuit is determined to provide the ratios $|V_{10}|/|V_{12}|$, $|V_{12}|/|V_{20}|$, $|V_{20}|/|V_{10}|$, a measure for the phase difference $\varphi$ between $V_{12}$ and $V_{10}$, a measure for the phase difference $\psi$ between $V_{20}$ and $V_{10}$, and a measure for the phase difference $\chi$ between $V_{20}$ and $V_{12}$.

In an exemplary embodiment, the detector circuit is an impedance detector that may be utilized in an impedance measurement system, e.g. of a mobile communication device.

In an exemplary embodiment, the calculation circuit of the detector circuit utilizes a lookup table. A lookup table is a simple but effective means to obtain an angle $\alpha$ from $\cos$ α. Thus, the phase differences φ, ψ, and χ can easily be provided at the signal output of the detector circuit.

Figure 1:
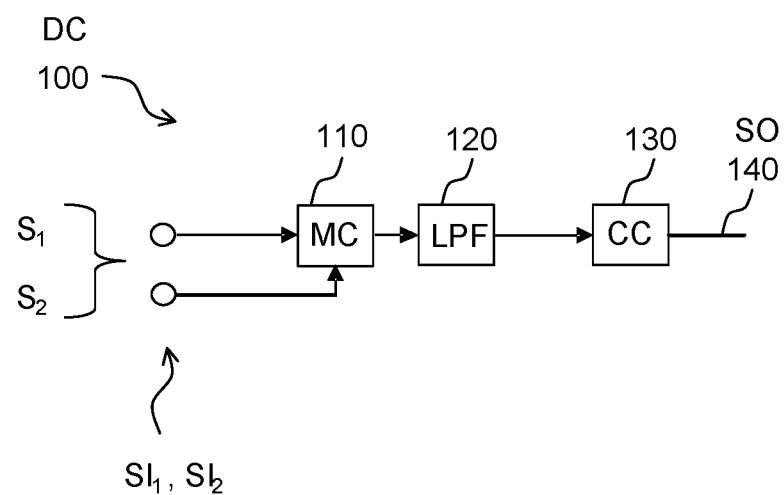
FIG. 1 schematically shows a detector circuit DC comprising a multiplication circuit MC and a calculation circuit CC.

FIG. 1 schematically shows an embodiment of the detector circuit DC 100 comprising a multiplication circuit MC 110 provided for obtaining two input signals $S_1$, $S_2$ at at least two signal inputs ($SI_1$, $SI_2$). The two signals $S_1$ and $S_2$ may have a form as shown in equations 1 and 2. By multiplying these two signals, e.g. via a dot product circuit in the multiplication circuit MC 110, a product signal is obtained that contains different frequency components as shown in equation 3. The frequency component having a frequency of 2ω is removed by the low pass filter LPF 120 connected after the multiplication circuit MC 110. As a result, the low pass filter LPF 120 provides an output signal that is mainly proportional to the dot product $S_1 \cdot S_2$. This dot product is analyzed by the calculation circuit CC 130. The dot product $S_1 \cdot S_2$ contains information about the absolute value of $S_1$, the absolute value of $S_2$ and the phase difference between $S_1$ and $S_2$. By extracting the respective information from the input signals, the detector circuit DC 100 is able to provide the ratios. The input signals S1, S2 can carry three different quantities such as electric potentials, voltages or currents simultaneously or one after another.

A multiplication circuit can comprise conventional mixer circuits and further circuit components. The multiplication circuit is, thus, not restricted to a mixer circuit.

FIG. 2 schematically shows a circuit 200 having a signal path SP 210 in which radio frequency signals may propagate. A potentially variable load impedance is denoted as $Z_x$ 212. Further, the signal path SP 210 comprises a sensing element $Z_{sense}$ 220 used for determining impedance information $Z_x$. The sensing impedance $Z_{sense}$ 220 could be established by an inductive element IE. $V_{10}$, $V_{20}$, and $V_{12}$ could be the voltage differences, between the potentials $P_0$, $P_1$, and $P_2$ respectively. In the circuit shown in FIG. 2, when the signals $V_{10}$, $V_{12}$, and $V_{20}$ are voltages, then $V_{10} = V_{12} + V_{20}$.

FIG. 3 shows the correlations between the input signals $V_{12}$, $V_{10}$, and $V_{20}$. $V_{12}$ could be the voltage drop across the sensing element $Z_{sense}$, which may be an inductive element. $V_{10}$ may be the voltage between the input of the signal path and a ground potential. $V_{20}$ is the voltage drop across the unknown load impedance $Z_x$. Then, $V_{10}$ is the sum of voltages $V_{12}$ and $V_{20}$. Accordingly, the three voltages establish a triangle defined by the length of the vectors and the respective angles. The cosine of each angle is determined by the ratios of the side lengths of the triangle.

Figure 4A:
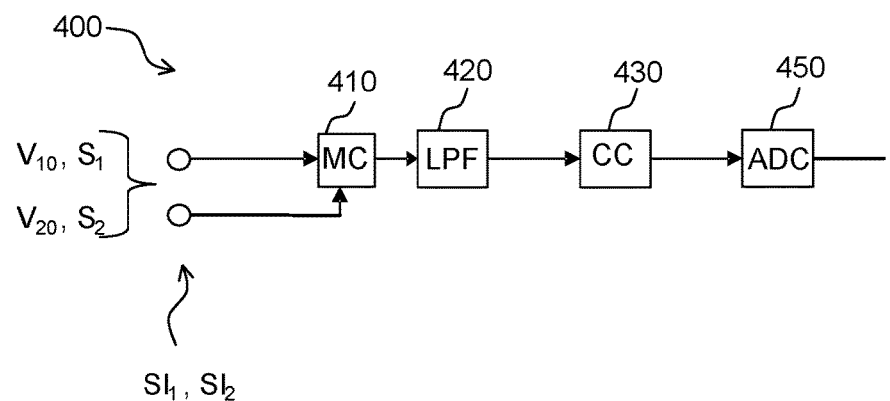
FIG. 4A schematically shows a detector circuit comprising a multiplication circuit MC, a low pass filter LPF, a calculation circuit CC, and an analog/digital converter ADC.

FIG. 4A shows an embodiment of the detector circuit 400 where an analog/digital converter ADC 450 is connected after the calculation circuit CC 430. Then, it is possible that a multiplier of the multiplication circuit MC 410, the low pass filter LPF 420 and the calculation circuit CC 430 work in the analog domain. The analog/digital converter ADC 450 provides digital information about amplitudes, amplitude ratios, and/or phase differences.

Figure 4B:
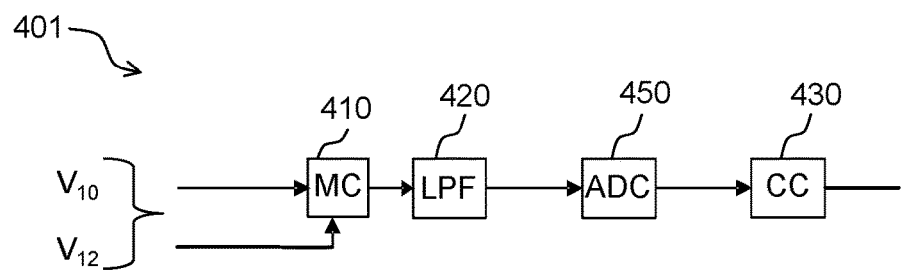
FIG. 4B shows an embodiment of a detector circuit where an analog/digital converter is connected between a low pass filter LPF and a calculation circuit CC.

FIG. 4B shows an embodiment of the detector circuit 401 where the analog/digital converter ADC 450 is connected between the low pass filter LPF 420 and the calculation circuit CC 430. Then, it is possible that a multiplier of the multiplication circuit MC 410 and the low pass filter LPF 420 work in the analog domain while the calculation circuit CC 430 works in the digital domain. It is, however, possible that the input signals, e.g. $V_{10}$ and $V_{12}$, are directly fed into an analog/digital converter ADC 450 and multiplication, low pass filtering and the calculation of amplitude information or phase difference information is done in the digital domain.

Figure 4C:
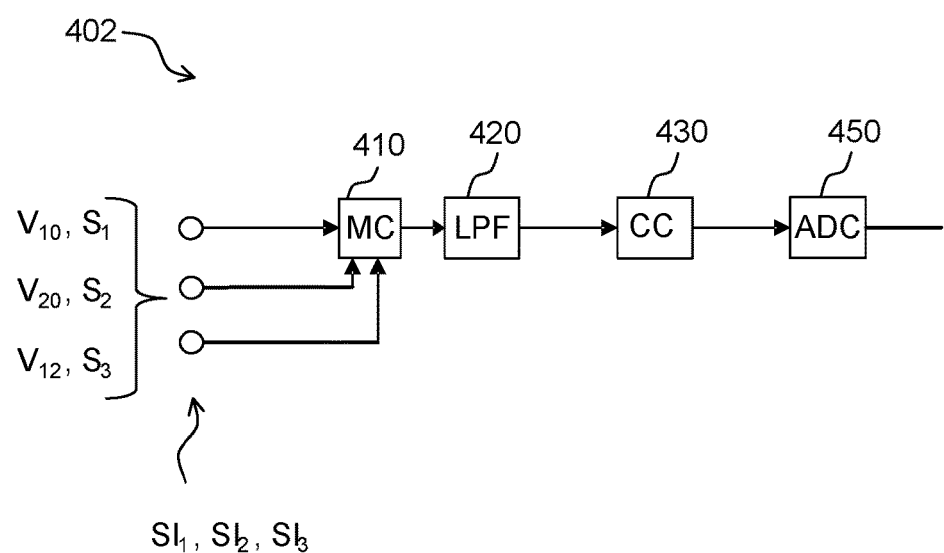
FIG. 4C shows an embodiment of a detector circuit with three signal inputs.

FIG. 4C shows an embodiment of the detector circuit 402 where three input signals $S_1$, $S_2$, $S_3$ can be received via signal inputs $SI_1$, $SI_2$, $SI_3$ and processed simultaneously. Otherwise, the information may be provided by signals applied to two inputs one after another.

Figure 5:
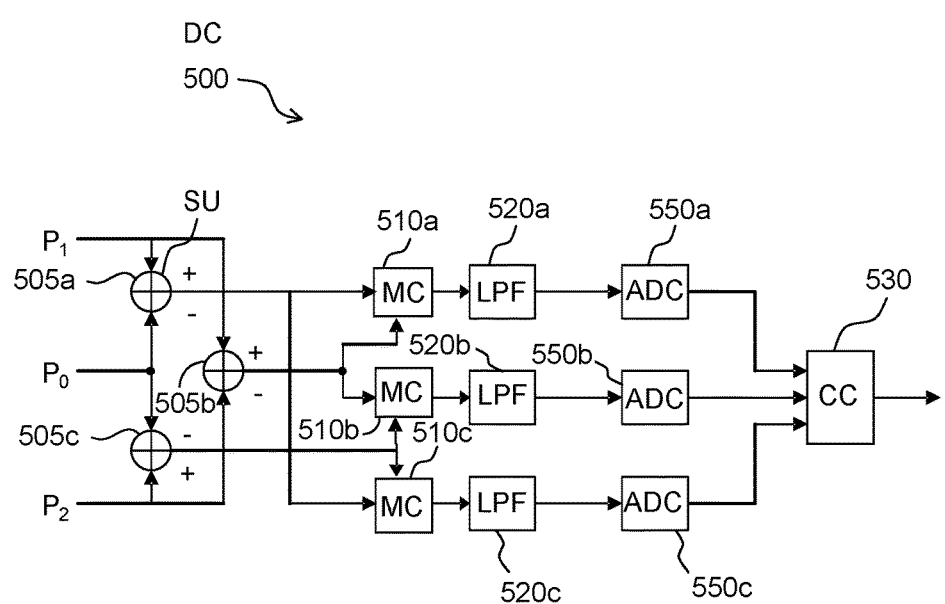
FIG. 5 shows a detector circuit DC comprising three subtraction circuits, three multiplication circuits, three low pass filters, three analog/digital converters ADC and a calculation circuit CC.

FIG. 5 shows an embodiment of the detector circuit DC 500 where input signals $V_{10}$, $V_{12}$, and $V_{20}$ are generated as voltage differences between electrical potentials $P_1$, $P_0$, and $P_2$. The detector circuit DC 500 comprises subtractors 505a, 505b and 505c, configured to generate voltage differences between electrical potentials $P_1$, $P_0$, and $P_2$. The detector circuit DC 500 comprises three chains, each chain comprising a multiplier 510a, 510b, 510c, a low pass filter LPF 520a, 520b, 520c, and an analog/digital circuit ADC 550a, 550b, 550c. With such a three-chain solution, the three dot products can be retrieved simultaneously which can be used to calculate phase differences and level ratios. The multiplication circuit MC comprises at least three sections. Each subsection may comprise a mixer and further circuit components.

Figure 6:
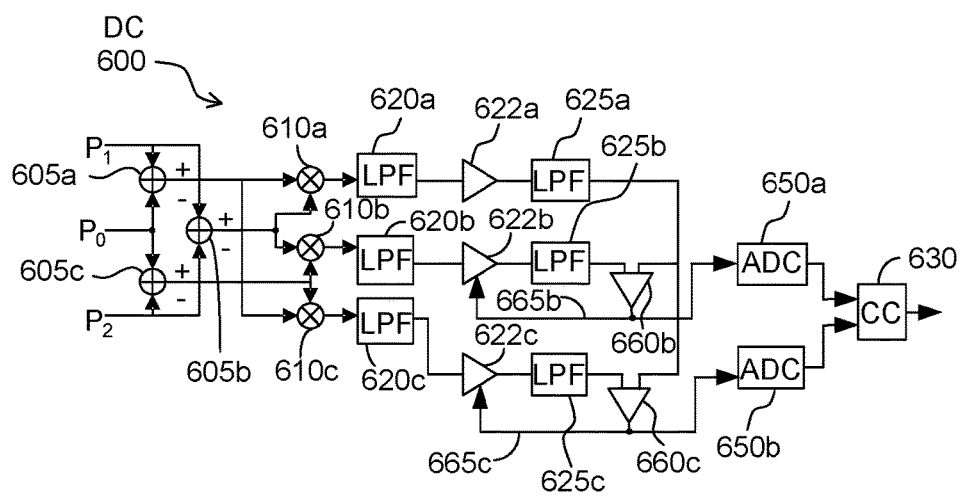
FIG. 6 shows an embodiment of a detector circuit similar to that of FIG. 5, further comprising amplifiers AMP.

FIG. 6 shows an embodiment of the detector circuit 600 where the dot product ratios $k_1$ and $k_2$ can be obtained by a feedback loop. The detector circuit DC 600 comprises subtractors 605a, 605b and 605c, configured to generate voltage differences between electrical potentials $P_1$, $P_0$, and $P_2$. The detector circuit 600 comprises three chains. Each chain comprises a multiplier 610a, 610b, 610c, a low pass filter, LPF, 620a, 620b, 620c, an amplifier, AMP, 622a, 622b, 622c, e.g. a variable gain amplifier and optionally an additional low pass filter, LPF, 625a, 625b, 625c. The second chain and the third chain have a feedback loop between the second low pass filter 625b, 625c, and the respective amplifier, AMP, 622b, 622c. The amplifiers 622b, 622c can be variable gain amplifiers. The feedback loop comprises an additional operational amplifier OA 660b and 660c in the second and third chains. The dot products are obtained at the output of the first low pass filter LPF 620a, 620b, 620c of each chain. The feedback loop ensures that the multiplied dot products are identical. For that, the output of the second low pass filter LPF 625a of the first chain is connected to the operational amplifiers OA 660b and 660c of the second and third chain, respectively. As a result of the feedback loops 665b, 665c of the second and third chain, respectively, connected to the output of the second low pass filter 625a of the first chain, the ratio of the gain of the second amplifier 622b and the gain of the first amplifier 622a is identical to the ratio of the dot products: $(V_{10} \cdot V_{12})/(V_{20} \cdot V_{12})$. The ratio of the gain of the third amplifier 622c and the first amplifier 622a is identical to the ratio of the dot products: $(V_{10} \cdot V_{12})/(V_{12} \cdot V_{20})$. When the gain of the first amplifier 622a is $A_0$, the gain of the second amplifier 622b is $A_1$ and the gain of the third amplifier 622c is $A_2$ then $k_1 = A_2/A_0$ and $k_2 = A_1/A_0$. If $A_0$ is a known fixed value $A_1$ and $A_2$ can be the input of analog/digital converters ADC 650a, 650b from which $k_1$ and $k_2$ can be derived by the calculation circuit CC 630.

Figure 7:
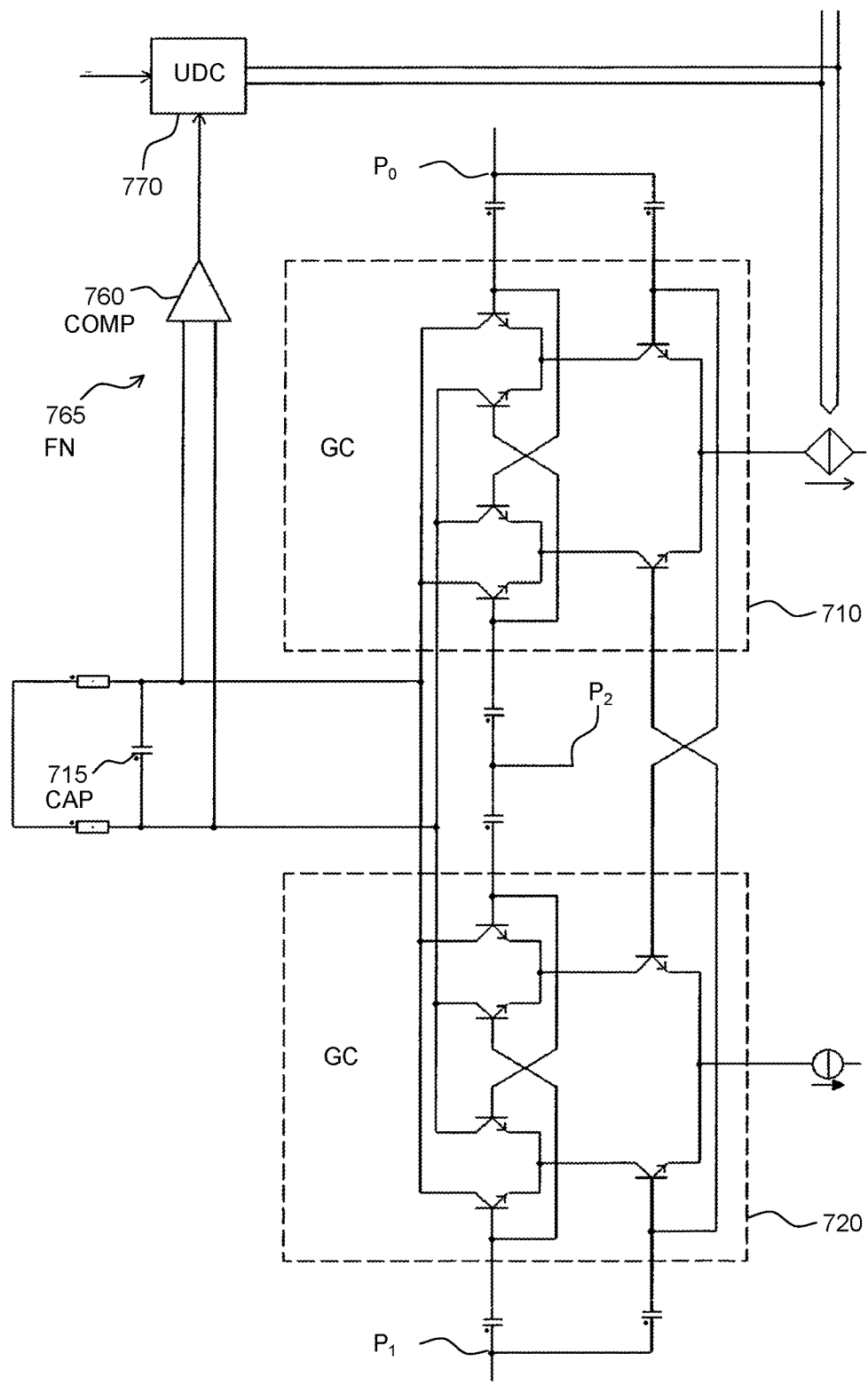
FIG. 7 shows an embodiment of the multiplication circuit comprising two Gilbert cells GC.

FIG. 7 shows an equivalent circuit diagram of a section of a detector circuit comprising two double balanced mixers, i.e. Gilbert cells GC 710 and 720. The lower double balanced mixer 720 multiplies $V_{12}$ and $V_{10}$. The upper double balanced mixer 710 multiplies $V_{20}$ and $V_{10}$. The outputs are subtracted from each other by combining the collectors and low pass filtering by the capacitor CAP 715. The differential output voltage is the difference of the two amplified dot products. A comparator COMP 760 in a feedback network FN 765 connected to the combined output of these multiplication circuits, i.e. mixers 710, 720, controls the up/down port of an up/down counter UDC 770 and the contents of the up/down counter UDC 770 controls one of the mixer gains by controlling its tail current. When settled, the ratio of the two tail currents is the ratio of the two dot products and is expressed directly in the digital contents of the up/down counter UDC 770. Instead of the up/down counter UDC 770, another digital block that, e.g. iteratively, generates a digital word based on the comparator output is also possible. Such a block may be a SAR-block (SAR=Successive Approximation Register).

Another system can be used to obtain a dot product ratio, e.g. $k_1$, as a digital word. Then, $k_1$ and $k_2$ can be used directly for the required calculations.

Figure 8:
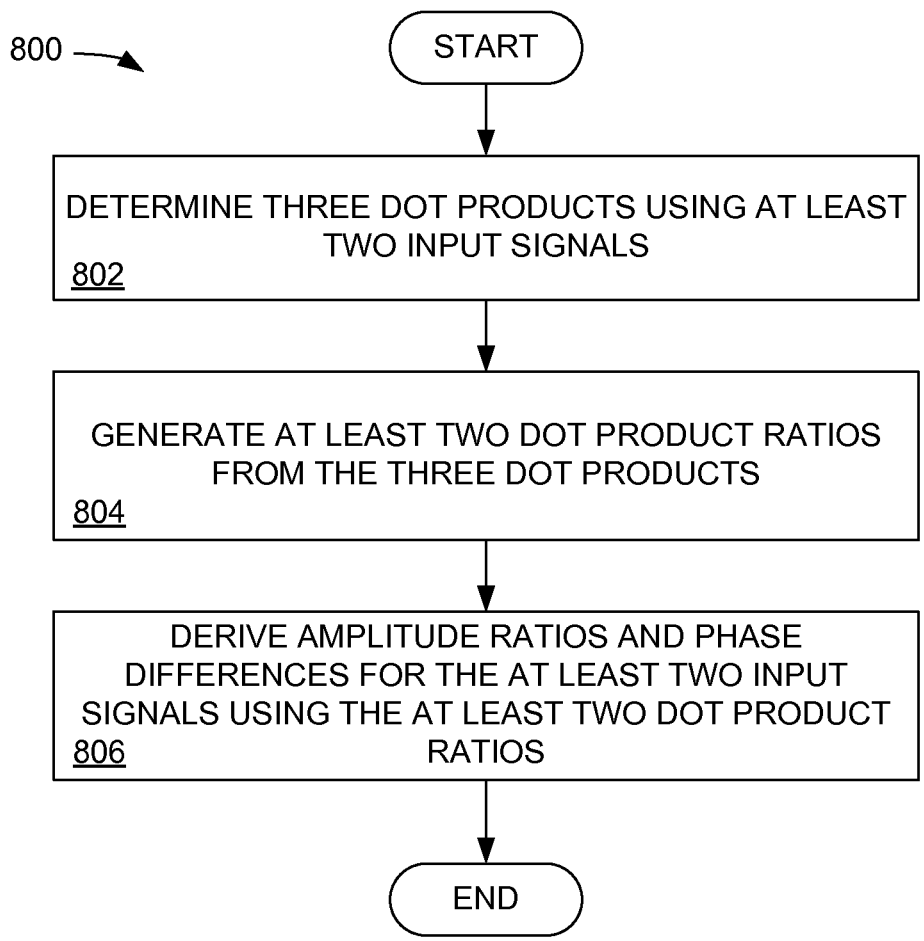
FIG. 8 is a flowchart showing an exemplary embodiment of a method for operating a detector circuit.

FIG. 8 is a flowchart showing an exemplary embodiment of a method for operating a detector circuit. In block 802, three dot products are determined using at least two input signals. In block 804, at least two dot product ratios are generated from the three dot products. In block 806, amplitude ratios and phase differences are derived for the at least two input signals using the at least two dot product ratios.

The detector circuit is not limited to the embodiments described in the specification or shown in the figures. Phase detectors comprising further elements such as further multiplication circuits, filter circuits and/or calculation circuits or combinations thereof are also comprised by the present invention. The features shown above do not exclude each other. The phase detector can comprise each feature in combination with other features.

LIST OF REFERENCE SYMBOLS

ADC: analog/digital circuit;
CAP: capacitive element;
CC: calculation circuit;
COMP: comparator;
DC: detector circuit;
FN: feedback network;
GC: Gilbert cell;
IE: inductive element;
LPF: low pass filter;
MC: multiplication circuit;
OA: operational amplifier;
$P_1$, $P_0$, $P_2$: electric potentials;
$S_1$, $S_2$, $S_3$: input signals;
$SI_1$, $SI_2$, $SI_3$: signal inputs;
SO: signal output;
SP: signal path;
SU: subtraction circuit;
UDC: up/down counter;
$V_{10}$, $V_{12}$, $V_{20}$: input signals;
$V_1$, $V_2$: input signals;
Z, $Z_{sense}$, $Z_x$: impedances;
α, β, γ: phase differences between input signals;
φ', φ, χ, ψ: phase differences between input voltages or currents.

The detector circuit described herein may be implemented on one or more ICs, analog ICs, RFICs, mixed-signal ICs, ASICs, printed circuit boards (PCBs), electronic devices, etc. The detector circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the detector circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. A device, comprising:
a sensing impedance $Z_{sense}$;
an impedance $Z_x$ connected in a series connection with the sensing impedance $Z_{sense}$;
a multiplication circuit configured to derive a signal representing a product of a first signal $S_1$ received at a first signal input and a second signal $S_2$ received at a second signal input, $S_2$ having a phase difference $\beta$ relative to the first signal $S_1$, wherein the first signal $S_1$ is a voltage $V_{10}$ across the series connection of the sensing impedance $Z_{sense}$ and the impedance $Z_x$ wherein the second signal $S_2$ is a voltage $V_{12}$ across the sensing impedance $Z_{sense}$, and a third signal $S_3$ received at a third signal input is a voltage $Y_{20}$ across the impedance $Z_x$, and wherein the third signal $S_3$ has a phase difference $\alpha$ relative to the first signal $S_1$;
a low pass filter configured to remove a selected frequency component from the signal representing the product of $S_1$ and $S_2$ to provide an output signal substantially proportional to a dot product $S_1 \cdot S_2$; and
a calculation circuit configured to receive the output signal substantially proportional to the dot product $S_1 \cdot S_2$ and generate a signal output having a ratio $|S_1|/|S_2|$ and the phase difference $\beta$.

2. The device of claim 1, wherein the multiplication circuit and the low pass filter are configured to derive three dot-products $S_1 \cdot S_2$, $S_2 \cdot S_3$, and $S_1 \cdot S_3$.

3. The device of claim 2, further comprising a feedback network configured to generate a ratio of two of the dot products $S_1 \cdot S_2$, $S_2 \cdot S_3$, and $S_1 \cdot S_3$.

4. The device of claim 1, further comprising three subtraction circuits configured to derive $V_{10}$ and $V_{12}$ from three input potentials $P_0$, $P_1$, $P_2$.

5. The device of claim 1, wherein the multiplication circuit further comprises:
two (2) double balanced mixers or Gilbert cells and a capacitance configured to generate a differential output voltage that represents a difference of the dot product $S_1 \cdot S_2$ and another dot product based on the third signal $S_3$;
a comparator configured to receive the differential output voltage and generate an up/down signal; and
an up-down-counter responsive to the up/down signal and configured to control at least one of the two (2) double balanced mixers or Gilbert cells.

6. The device of claim 1, wherein the signal output is configured to provide:
ratios $|V_{10}|/|V_{12}|$, $|V_{12}|/|V_{20}|$, $|V_{20}|/|V_{10}|$;
a measure for the phase difference $\varphi$ between $V_{12}$ and $V_{10}$;
a measure for the phase difference $\psi$ between $V_{20}$ and $V_{10}$; and
a measure for the phase difference $\gamma$ between $V_{20}$ and $V_{12}$.

7. The device of claim 1, wherein the device is an impedance detector.

8. A device, comprising:
a multiplication circuit configured to receive a first signal $S_1$ and a second signal $S_2$ having a phase difference $\beta$ relative to the first signal $S_1$, the multiplication circuit comprising two double balanced mixers or Gilbert cells, a comparator, and an up-down-counter, the double balanced mixers or Gilbert cells and a capacitance configured to generate a differential output voltage representing a difference of a first dot product $S_1 \cdot S_2$ and another dot product based on a third signal $S_3$ received by the multiplication circuit, the comparator configured to receive the differential output voltage and generate an up/down signal, the up-down-counter responsive to the up/down signal and configured to control at least one of the double balanced mixers or Gilbert cells;
a low pass filter configured to remove a selected frequency component from a product of $S_1$ and $S_2$ to derive a signal representing the first dot product $S_1 \cdot S_2$; and
a calculation circuit configured to receive the signal representing the first dot product $S_1 \cdot S_2$ and generate a signal output having a ratio $|S_1|/|S_2|$ and the phase difference $\beta$.

9. The device of claim 8, wherein:
the first signal $S_1$ is a voltage $V_{10}$ across a serial connection of a sensing impedance $Z_{sense}$ and an impedance $Z_x$; and
the second signal $S_2$ is a voltage $V_{12}$ across the sensing impedance $Z_{sense}$.

10. The device of claim 9, wherein:
the multiplication circuit is configured to receive the third signal $S_3$;
the third signal $S_3$ is a voltage $V_{20}$ across the impedance $Z_x$; and
the third signal $S_3$ has a phase difference $\alpha$ relative to the first signal $S_1$.

* * * * *